US012730001B2

(12) United States Patent
Chamakura et al.

(10) Patent No.: US 12,730,001 B2
(45) Date of Patent: Sep. 8, 2026

(54) ELECTRONIC DEVICES WITH AMBIENT FLICKER DETECTION

(71) Applicant: Apple Inc., Cupertino, CA (US)

(72) Inventors: Anand K Chamakura, San Jose, CA (US); Stephen N Sweet, San Jose, CA (US); Ali Motamed, San Francisco, CA (US); Dong Zheng, Los Altos, CA (US); Jianjun Guo, San Jose, CA (US); Chau H Nguyen, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 44 days.

(21) Appl. No.: 18/613,515

(22) Filed: Mar. 22, 2024

(65) Prior Publication Data

US 2025/0067595 A1 Feb. 27, 2025

Related U.S. Application Data

(60) Provisional application No. 63/578,632, filed on Aug. 24, 2023.

(51) Int. Cl.

| | |
|---|---|
| ***G01J 1/42*** | (2006.01) |
| ***G01J 1/44*** | (2006.01) |
| ***G01J 1/46*** | (2006.01) |
| ***H03F 3/08*** | (2006.01) |

(52) U.S. Cl.
CPC ............... *G01J 1/4204* (2013.01); *G01J 1/44* (2013.01); *G01J 1/46* (2013.01); *H03F 3/08* (2013.01); *H03F 3/087* (2013.01); *G01J 2001/446* (2013.01)

(58) Field of Classification Search
CPC .... G01J 1/4204; G01J 1/44; G01J 1/46; G01J 2001/446; H03F 3/08; H03F 3/087
See application file for complete search history.

(56) References Cited

U.S. PATENT DOCUMENTS

| | | | |
|---|---|---|---|
| 8,253,613 | B2 | 8/2012 | Holcombe |
| 8,803,096 | B2 | 8/2014 | Holcombe et al. |
| 9,417,734 | B2 | 8/2016 | Raynor et al. |

(Continued)

FOREIGN PATENT DOCUMENTS

| | | | |
|---|---|---|---|
| CN | 216696695 | U | 6/2022 |
| KR | 0166624 | B1 | 5/1999 |

*Primary Examiner* — Jennifer D Bennett
(74) *Attorney, Agent, or Firm* — Treyz Law Group, P.C.; David K. Cole

(57) ABSTRACT

An electronic device may have a sensor to measure ambient flicker. The sensor may be a sigma-delta converter. The flicker may be calculated based on the voltage output of the sigma-delta converter and the number of times the sigma-delta converter is triggered during a predetermined period, thereby reducing the voltage output. In particular, a fast Fourier transform (FFT) may be used on these values to determine the flicker. If desired, filtering and/or non-uniform sampling may be incorporated to avoid aliasing. Additionally or alternatively, a Lomb-Scargle spectral analysis may be used to prevent the attenuation of the measured flicker signals. As an alternative to using a sigma-delta converter to determine ambient flicker, a folding capacitive transimpedance amplifier (C-TIA) circuit or a circuit with an analog to digital converter and digital filter may be used to measure the ambient flicker.

8 Claims, 15 Drawing Sheets

(56) References Cited

U.S. PATENT DOCUMENTS

| | | | | |
|---|---|---|---|---|
| 9,805,237 | B2 | 10/2017 | Feng et al. | |
| 10,609,300 | B2 | 3/2020 | Feng et al. | |
| 2014/0070078 | A1* | 3/2014 | Land | H04M 1/72403 250/214.1 |
| 2015/0102209 | A1* | 4/2015 | Xu | G01J 1/46 250/214 LA |
| 2015/0279882 | A1* | 10/2015 | Yagi | H04N 25/78 250/206 |

* cited by examiner

ELECTRONIC DEVICES WITH AMBIENT FLICKER DETECTION

This application claims the benefit of U.S. provisional patent application No. 63/578,632, filed Aug. 24, 2023, which is hereby incorporated by reference herein in its entirety.

FIELD

This relates generally to electronic devices, and, more particularly, to electronic devices with sensors.

BACKGROUND

Electronic devices such as laptop computers, cellular telephones, and other equipment are sometimes provided with sensors. For example, sensors may be incorporated into a device to provide the device with information on current environmental or device conditions.

SUMMARY

An electronic device may have one or more sensors to measure ambient flicker. The sensors may include a sigma-delta converter. The sigma-delta converter may include a photodiode generates charge in response to ambient light, and a capacitor that reduces the output voltage when it exceeds a threshold. The flicker may be calculated based on the voltage output of the sigma-delta converter and the number of times the sigma-delta converter is triggered (e.g., the output voltage has been reduced) during a predetermined period. In particular, a fast Fourier transform (FFT) may be applied to these values to determine the flicker.

If desired, filtering and/or non-uniform sampling may be incorporated to avoid aliasing. Additionally or alternatively, a Lomb-Scargle spectral analysis may be used to prevent the attenuation of the measured flicker signals.

As an alternative to using a sigma-delta converter to determine ambient flicker, a folding capacitive transimpedance amplifier (C-TIA) circuit may be used to measure the ambient flicker. The folding capacitive transimpedance amplifier (C-TIA) circuit may use the same steps to measure flicker as the sigma-delta converter, but the reduction in voltage may occur using a folding circuit that is triggered by a timing and logic circuit.

In other embodiments, a circuit that incorporates a digital filter and a current source that is set by the digital filter may be used to measure ambient flicker. In particular, the digital filter may set the current source to match the current generated by the photodiode, and the flicker portion may be determined.

DETAILED DESCRIPTION

An electronic device may include one or more environmental sensors, such as an ambient light sensor and a camera. It may be desirable to determine the flicker of ambient light sources. For example, the flicker may be measured and used to avoid potential issues with images and/or videos captured by a camera in the device.

To determine ambient flicker, a sigma-delta converter may be used to measure ambient light. The sigma-delta converter may include a photodiode that generates charge in response to ambient light and a capacitor that reduces an output voltage when a voltage of the generated charge exceeds a threshold. The flicker may be determined based on the voltage output of the sigma-delta converter and the number of times the sigma-delta converter is triggered (e.g., the voltage is reduced) during a predetermined period. In particular, a fast Fourier transform (FFT) may be applied to these values to determine the flicker. If desired, filtering and/or non-uniform sampling may be incorporated to avoid aliasing. Additionally or alternatively, a Lomb-Scargle spectral analysis may be used to prevent the attenuation of the measured flicker signals.

As an alternative to using a sigma-delta converter to determine ambient flicker, a folding capacitive transimpedance amplifier (C-TIA) circuit may be used to measure the ambient flicker. The folding capacitive transimpedance amplifier (C-TIA) circuit may use the same steps to measure flicker as the sigma-delta converter, but the reduction in voltage may occur using a folding circuit that is triggered by a timing and logic circuit.

In other embodiments, a circuit that incorporates a digital filter and a current source that is set by the digital filter may be used to measure ambient flicker. In particular, the digital filter may set the current source to match the current generated by the photodiode, and the flicker portion may be determined. In this way, ambient flicker may be measured in an environment surrounding the electronic device.

Figure 1:
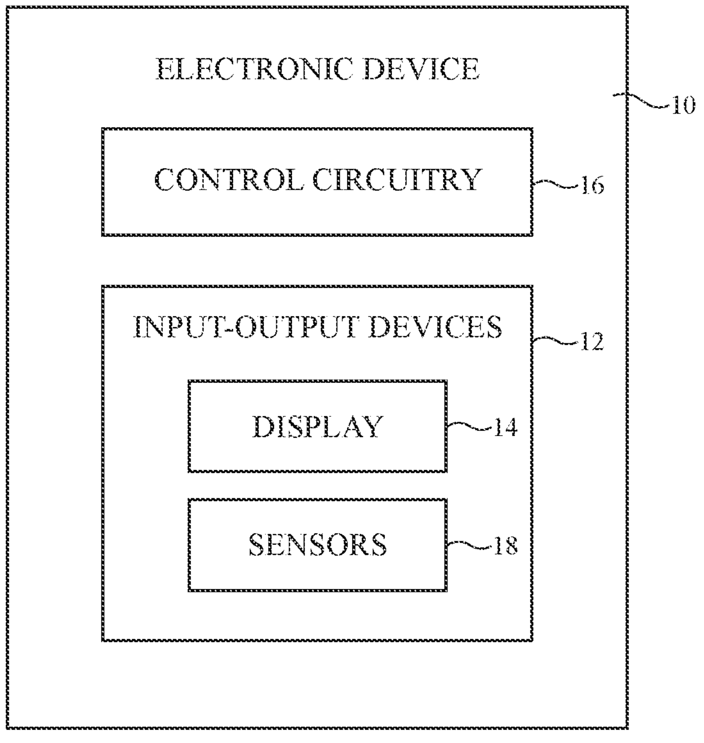
FIG. 1 is a schematic diagram of an illustrative electronic device having a display and sensor components in accordance with some embodiments.

An illustrative electronic device of the type that may be provided with one or more sensors is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch or other device worn on a user's wrist, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc. Control circuitry 16 may include communications circuitry for supporting wired and/or wireless communications between device 10 and external equipment. For example, control circuitry 16 may include wireless communications circuitry such as cellular telephone communications circuitry and wireless local area network communications circuitry. Some of the wireless communications circuitry in control circuitry 16 may emit radio-frequency (RF) signals. For example, a transceiver in the wireless communications circuitry may emit the RF signals.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. Display 14 may include any desired display technology, and may be an organic light-emitting diode (OLED) display, a liquid crystal display (LCD), a microLED display, or any other desired type of display.

Input-output devices 12 may also include sensors 18. Sensors 18 may include a capacitive sensor, a light-based proximity sensor, a magnetic sensor, an accelerometer, a force sensor, a touch sensor, a temperature sensor, a pressure sensor, a compass, a microphone, a radio-frequency sensor, a three-dimensional image sensor, a camera, a light-based position sensor (e.g., a lidar sensor), and other sensors. Sensors 18 may also include one or more light detectors that are configured to detect ambient light. Sensors 18 may, for example, include one or more monochrome ambient light sensors and one or more color ambient light sensors that are configured to measure ambient light from the environment in which device 10 is operated. A monochrome ambient light sensor may be used to measure ambient light intensity. A color ambient light sensor may be used to measure the color (e.g., color spectrum, color temperature, color coordinates, etc.) of ambient light and may be used to measure ambient light intensity.

In some illustrative embodiments, sensors 18 may include one or more sensors that measure ambient flicker. For example, sensors 18 may include a sigma-delta converter that measures ambient light and/or ambient flicker. Alternatively or additionally, sensors 18 may include a folding capacitive transimpedance amplifier (C-TIA) circuit may be used to measure the ambient flicker.

Figure 2:
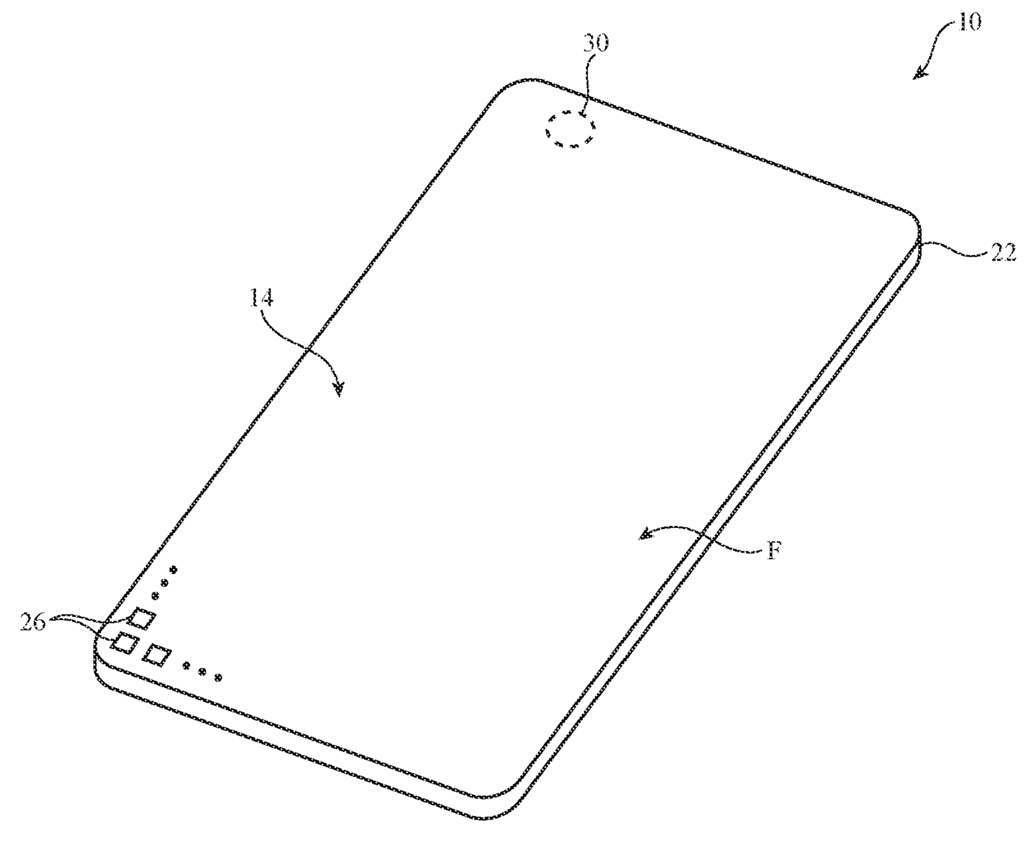
FIG. 2 is a perspective view of an electronic device with a sensor in accordance with some embodiments.

A perspective view of an illustrative electronic device of the type that may include one or more sensors that measure ambient flicker is shown in FIG. 2. In the example of FIG. 2, device 10 includes a display such as display 14 mounted in housing 22. Display 14 may be a liquid crystal display, an electrophoretic display, an organic light-emitting diode display, or other display with an array of light-emitting diodes (e.g., a display that includes pixels having diodes formed from crystalline semiconductor dies), may be a plasma display, may be an electrowetting display, may be a display based on microelectromechanical systems (MEMs) pixels, or may be any other suitable display. Display 14 may have an array of pixels 26 that extends across some or all of front face F of device 10 and/or other external device surfaces. The pixel array may be rectangular or may have other suitable shapes. Display 14 may be protected using a display cover layer (e.g., a transparent front housing layer) such as a layer of transparent glass, clear plastic, sapphire, or other clear layer. The display cover layer may overlap the array of pixels 26.

Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 22 and display 14 may separate an interior region of device 10 from an exterior region surrounding device 10. Housing 22 may be formed using a unibody configuration in which some or all of housing 22 is machined or molded as a single structure or may be formed using multiple structures (e.g., an internal frame structure, one or more structures that form exterior housing surfaces, etc.). If desired, a wristband or other strap may be coupled to a main portion of housing 22 (e.g., in configurations in which device 10 is a wristwatch).

Pixels 26 may cover substantially all of the front face of device 10 or display 14 may have inactive areas (e.g., notches, recessed areas, rectangular areas, or other regions) that are free of pixels 26. The inactive areas may be used to accommodate an opening for a speaker and windows for optical components such as one or more image sensors, analog sensors such as ambient light sensors, optical proximity sensors, three-dimensional image sensors such as structured light three-dimensional image sensors, and/or a camera flash, etc. In an illustrative configuration, pixels 26 may extend over the entirety of the front surface F of device 10 and may overlap a sensor, such as an ambient light sensor or other sensor that measures ambient flicker, in region 30.

In this type of arrangement, ambient light may pass to the ambient light sensor in region 30 through the array of pixels 26 in display 14.

However, region 30, which may overlap an ambient flicker sensor in device 10, may be formed anywhere on device 10. For example, the sensor may be on a rear surface (opposite front surface F), one of the sidewalls between the rear surface and front surface F, on front surface F but not overlapped by display 14, or at any other location in device 10. Moreover, region 30 may overlap any desired type of sensor, such as an ambient light sensor, a pressure sensor, an accelerometer, or a sound sensor. In some embodiments, region 30 may be an opening in housing 22, or region 30 may be a portion of housing 22 that covers the sensor.

Figure 3:
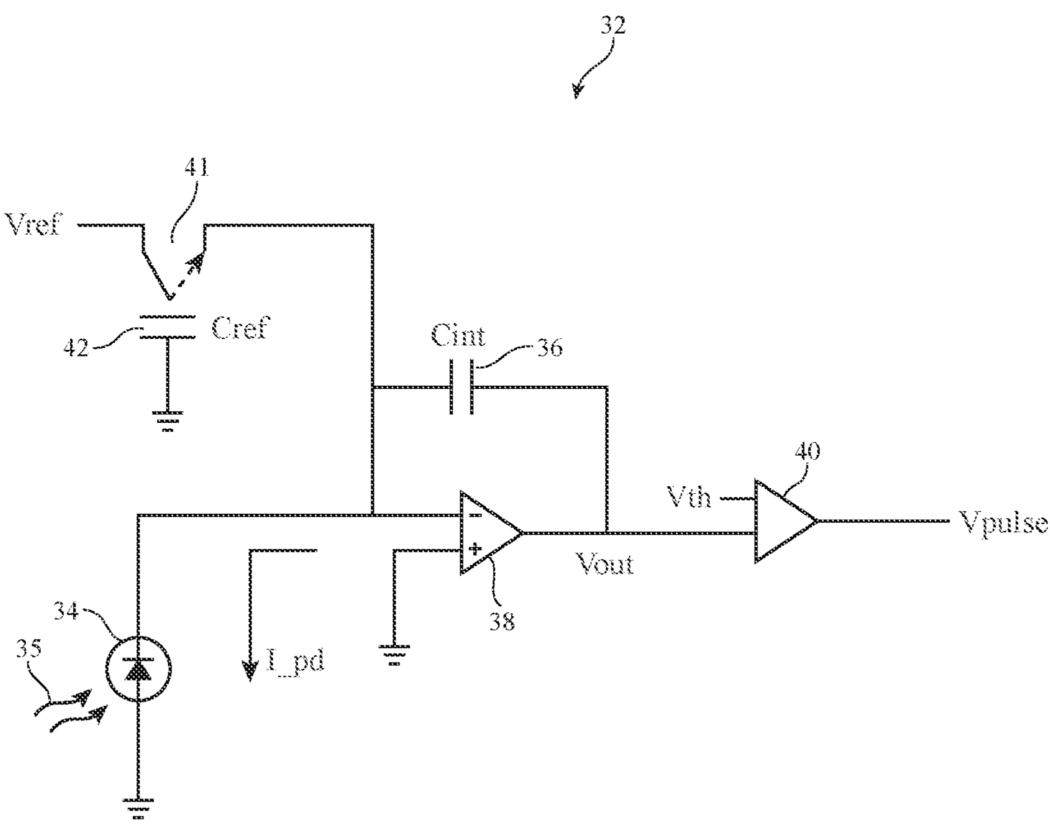
FIG. 3 is a diagram of an illustrative sigma-delta converter in accordance with some embodiments.

An illustrative sensor that may be incorporated into region 30 is shown in FIG. 3. As shown in FIG. 3, sigma-delta converter 32 may include photodiode 34, integrating capacitor Cint 36, operational transconductance amplifier (OTA) 38, comparator 40, and reference capacitor Cref 42.

In particular, photodiode 34 may be coupled to Cint 36 and to an input of OTA 38 with Cref 42. Cref 42 may be coupled at capacitive switch 41 to Vref, a reference voltage. Integrating capacitor Cint 36 may bridge OTA 38. The output of Cint 36 may be coupled to an input of comparator 40 with threshold voltage Vth.

In operation, as light 35 falls on photodiode 34, photocurrent is generated. The generated photocurrent flows through integrating capacitor Cint 36 because the input to OTA 38 represents an approximately infinite impedance. Because one end of Cint 36 is virtual ground, the other end Vout ramps up linearly with time according to Equation 1, $$I_{pd} = C_{int}\left(\frac{dV_{out}}{dtV_{out}}\right) = \left(\frac{I_{pd}}{C_{int}}\right) * t \quad (1)$$

where I_pd is the current of photodiode 34 and t is the time.

As Vout increases and exceeds the threshold of comparator 40, Vth, comparator 40 is triggered, causing Vpulse to register one pulse (1 count). As a result, the charge on Cref 42 is dumped on Cint 36 via capacitive switch 41, which causes Vout to drop by a voltage given by Equation 2, $$V_{drop} = V_{ref} * \frac{C_{ref}}{C_{int}} \quad (2)$$

and the cycle may repeat as photodiode 34 generates more current in response to ambient light. An illustrative waveform of Vout generated by a sigma-delta converter, such as sigma-delta converter 32, is shown in FIG. 4.

Figure 4:
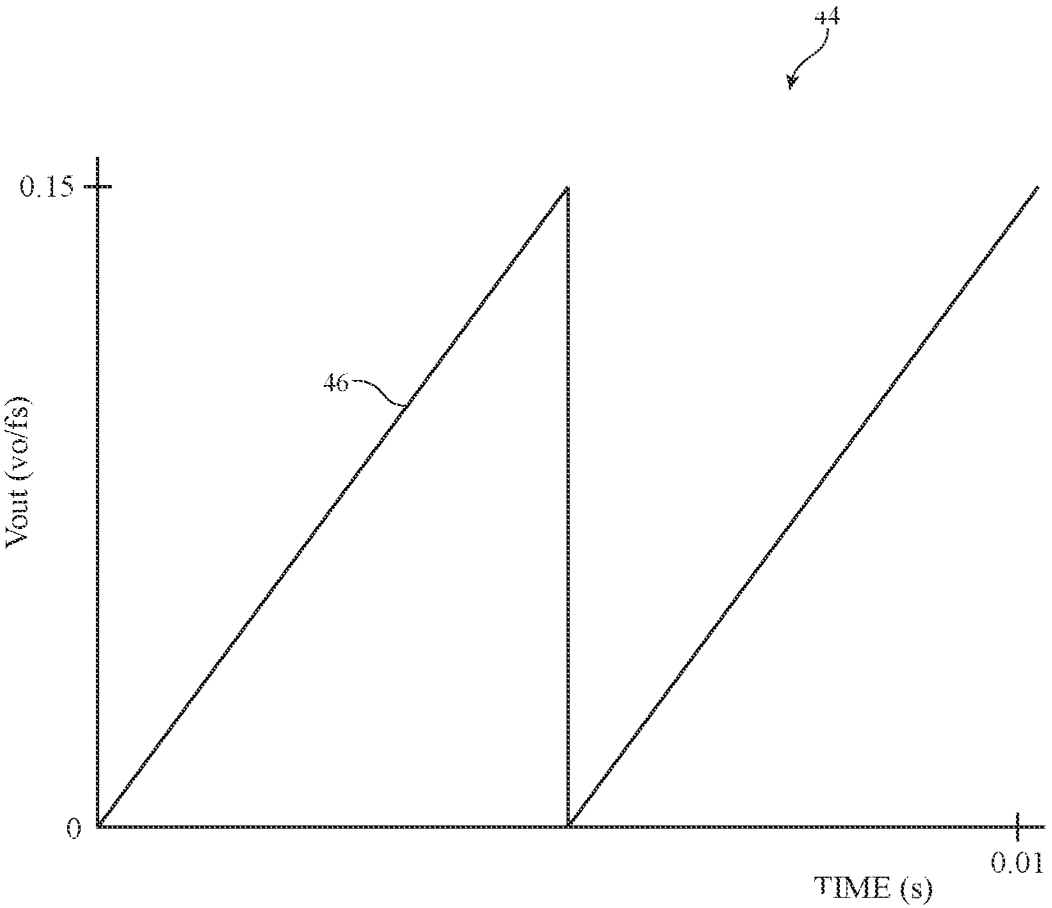
FIG. 4 is a diagram of an illustrative waveform generated by a sigma-delta converter in accordance with some embodiments.

As shown in FIG. 4, illustrative graph 44 may give a relationship between Vout (e.g., the output voltage of Cint 36 in FIG. 3 and time. The illustrative example of FIG. 4 shows a Vout vs. time relationship when Cint=Cref, and Vth=Vref=150 mV. In general, however, threshold voltage Vth and reference voltage Vref may have any suitable values.

As shown by curve 46, as the light intensity (e.g., the intensity of ambient light on photodiode 34 of FIG. 3) increases, voltage Vout ramps with time. In other words, Vout may ramp faster, thereby increasing the count (Vpulse of FIG. 3) at a higher rate, when light intensity increases. Because Vout is reduced when comparator 40 is triggered, the total count (Vpulse) generated by comparator 40 over an integration period will give an indication of the light intensity.

In addition to, or instead of, measuring light intensity, a sigma-delta converter, such as sigma-delta converter 32, may be used to determine ambient light flicker. An illustrative method that may be used to detect flicker using a sigma-delta converter is shown in FIG. 5.

Figure 5:
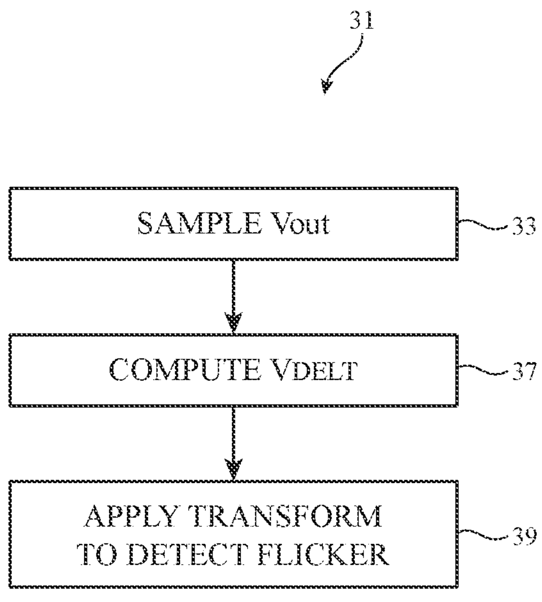
FIG. 5 is a flowchart of illustrative steps that may be used to determine ambient light flicker in accordance with some embodiments.

As shown in FIG. 5, flowchart 31 may begin with step 33, in which Vout is sampled. In particular, an analog to digital converter (ADC), such as an ADC coupled to sigma-delta converter 32 of FIG. 3, may be used to sample Vout. The ADC may sample Vout at any suitable frequency, such as at 8 kHz, 16 kHz, between 4 kHz and 16 kHz, or other suitable frequency. In an illustrative embodiment, the ADC may sample Vout at a frequency of 8 kHz to detect a maximum ambient light flicker frequency of 4 kHz.

The ADC may generally sample Vout before and after charge removal (e.g., the drop of Vout of FIG. 4). An illustrative graph showing samples produced by an ADC sampling Vout is shown in FIG. 6A.

Figure 6A:
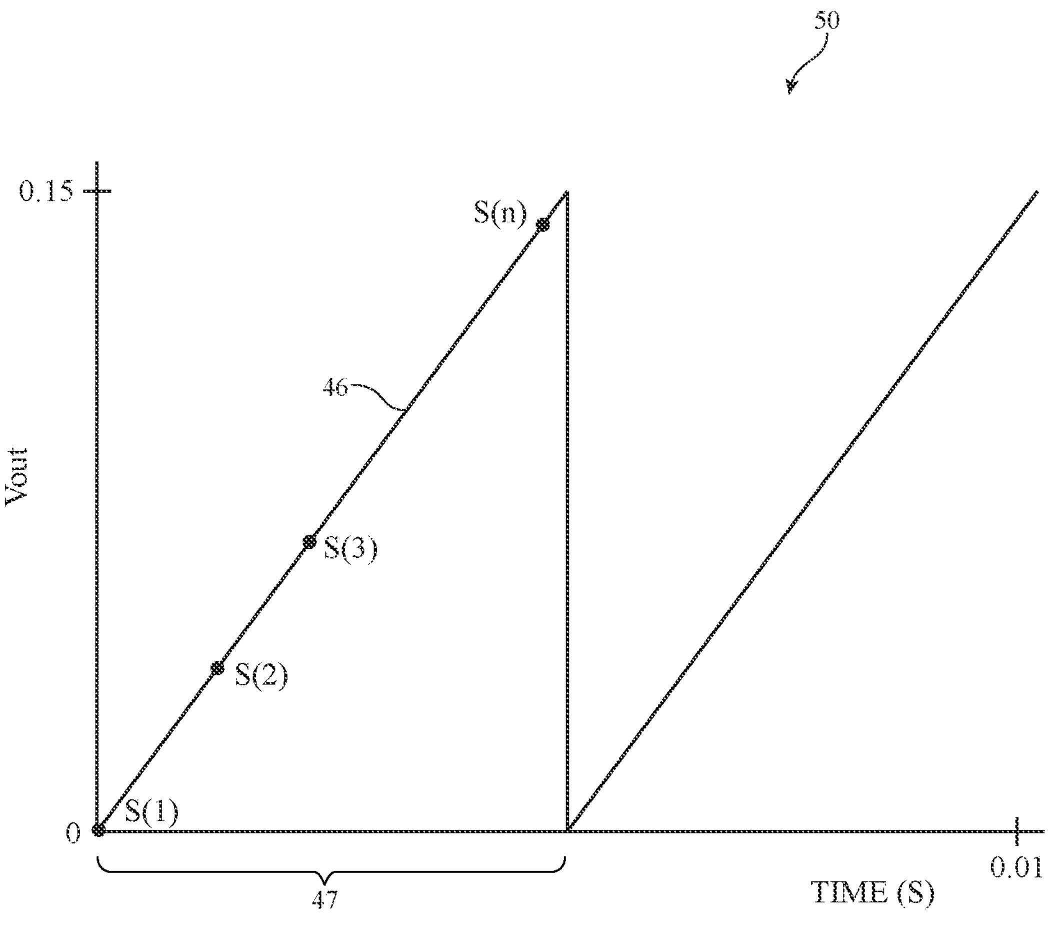
FIGS. 6A-6C are illustrative graphs that may be generated using the steps of FIG. 5 to determine the ambient light flicker in accordance with some embodiments.

As shown in FIG. 6A, curve 46 of graph 50 may be produced to give a relationship of Vout over time. Curve 46 of graph 50 may correspond with curve 46 of graph 44 (FIG. 4), for example. The ADC samples (e.g., the samples of Vout taken at step 33 of FIG. 5) are shown as s(1), s(2), s(3), . . . s(n) of FIG. 6A. In general, any suitable number of samples may be taken by the ADC. For example, the ADC may take at least 8 samples, at least 4 samples, at least 10 samples, or other suitable number (n) of samples during one integration period 47. In general, the number of samples (n) taken during integration period 47 may vary based on the length of integration period 47 and the frequency with which the samples are taken.

Returning to FIG. 5, after ADC samples s(1), s(2), s(3), . . . s(n) are taken by the ADC, a change in voltage may be determined at step 37. In particular, at step 37, the change in voltage Vdelt may be determined by Equation 3, $$V_{delt}(n) = s(n+1) - s(n) + V_{ref} * \text{crossing\_number\_} \propto \text{slope}(V_{out}) - I_{pd} \quad (3)$$

where crossing number is the number of times the comparator (e.g., comparator 40 of FIG. 3) is triggered during the time in which s(n+1) and s(n) are sampled.

Figure 6B:
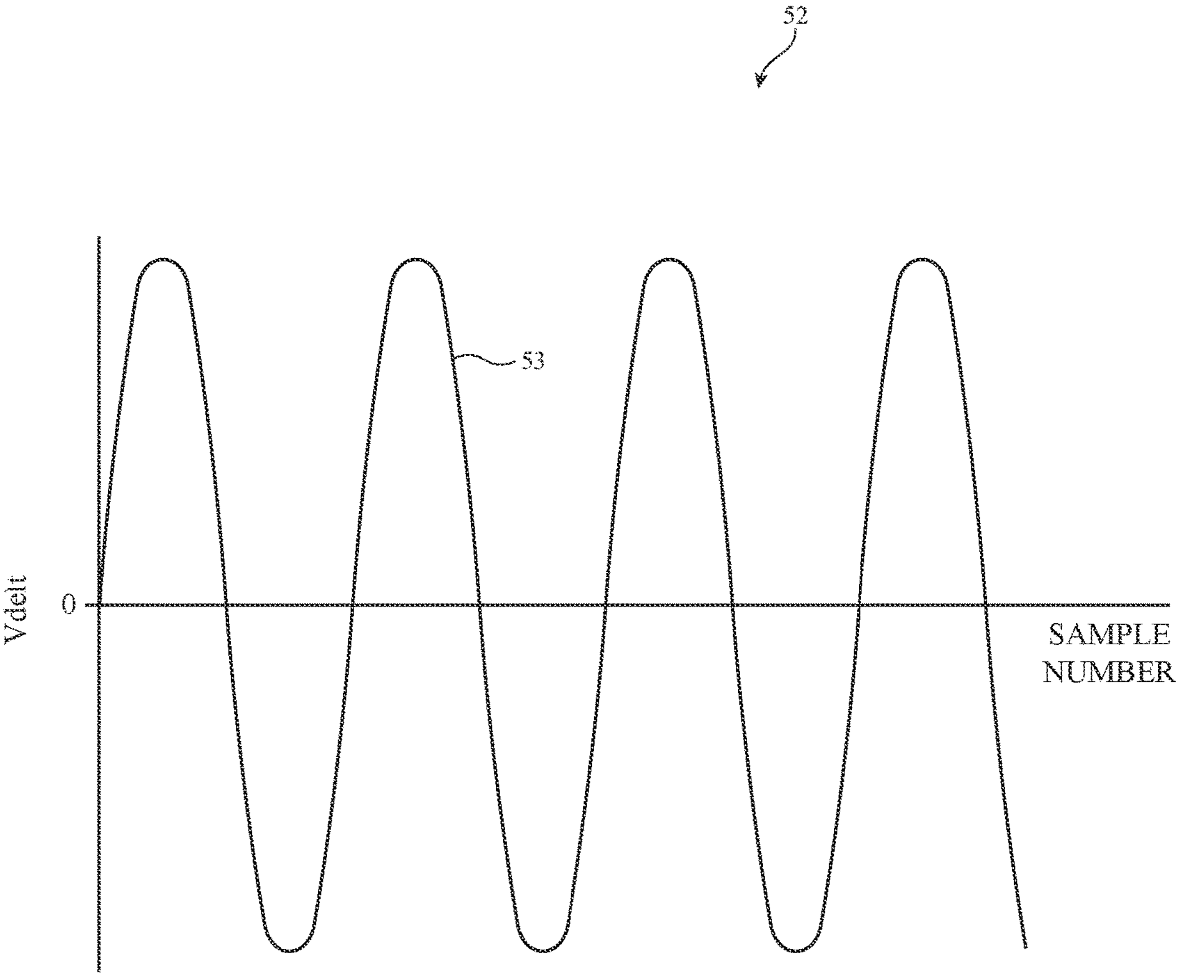

An illustrative graph showing Vdelt is shown in FIG. 6B. As shown in FIG. 6B, curve 53 of graph 52 may give a relationship between Vdelt and the number of samples (n). Curve 53 may give a sinusoidal relationship, as shown in FIG. 6B. However, this relationship is merely illustrative.

Returning to FIG. 5, after generating change in voltage Vdelt, a transform may be applied to Vdelt to determine the ambient flicker at step 39. In particular, a suitable transform, such as a fast Fourier transform (FFT) may be applied to Vdelt.

Figure 6C:
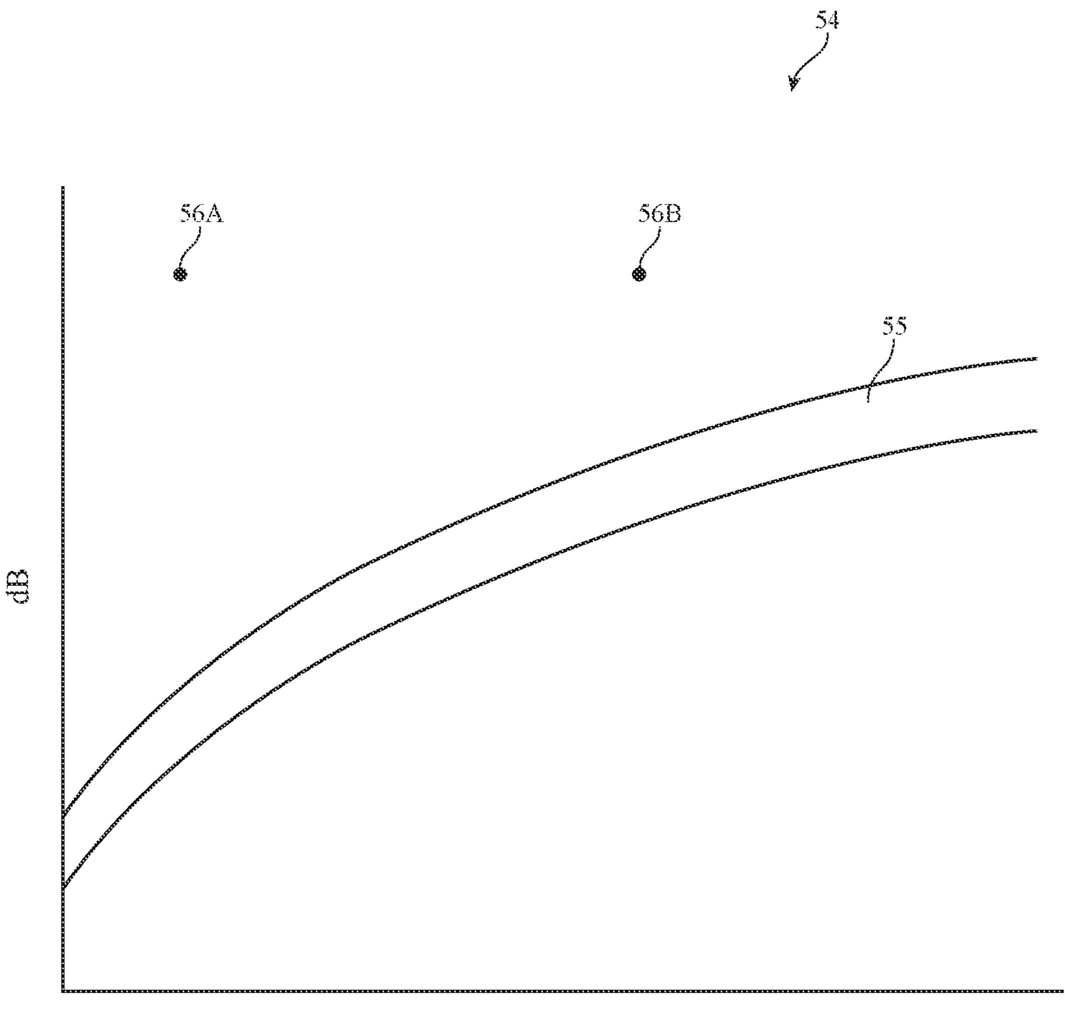

An illustrative graph showing a spectrum of Vdelt following the FFT (or other suitable transform) is shown in FIG. 6C. In particular, spectrum 55 of graph 54 may give an illustrative frequency response of the Vdelt signal. As shown, the FFT of Vdelt gives the frequency response of the signal as spectrum 55, and the light source flicker frequency is shown as signal peaks 56A and 56B. Therefore, peaks 56A and 56B may also be referred to as ambient flicker signals herein. In FIG. 6C, peaks 56A and 56B may be at 120 Hz and 2 kHz, respectively, which may correspond with the ambient light flicker. However, this is merely illustrative.

Peaks, such as peaks 56A and 56B will generally be present at frequencies that correspond to the frequency of ambient light flicker in a given environment. There may be a single peak 56, at least two peaks 56, at least three peaks 56, or any other number of peaks 56 that correspond with the frequency of ambient light flicker.

Using the method of FIG. 5 may allow for a high gain to obtained relative to ambient flicker detection that does not use the ADC sampling and/or transformation of FIGS. 6A-6C. In particular, the equivalent transimpedance gain is given by Equation 4, $$\text{Transimpedance Gain} = \frac{1}{F_s * C_{int}} \tag{4}$$

where Fs is the sampling rate/frequency of the ADC used to sample the output voltage Vout. For Fs=8 kHz and Cint=87 fF (as illustrative examples), the transimpedance gain is equivalent to 1.5 GOhm. Because Cint is lower than ambient flicker detection that does not reduce Cint when Cint exceeds a threshold voltage (e.g., as shown in FIGS. 4 and 6A), the transimpedance gain may be higher using the method of FIG. 5. Higher gain allows for an ADC with relatively low resolution to be used, as well as for the concurrent operation of the ALS function (average intensity by tallying the counts) and the flicker function.

However, in some situations, if the input signal (e.g., the ambient light flicker) has interference at a frequency higher than half the sampling rate (Fs/2) (e.g., 4 kHz in the illustrative example in which the sampling rate is 8 kHz), an aliasing signal may appear in the signal band. An illustrative example is shown in FIG. 7.

Figure 7:
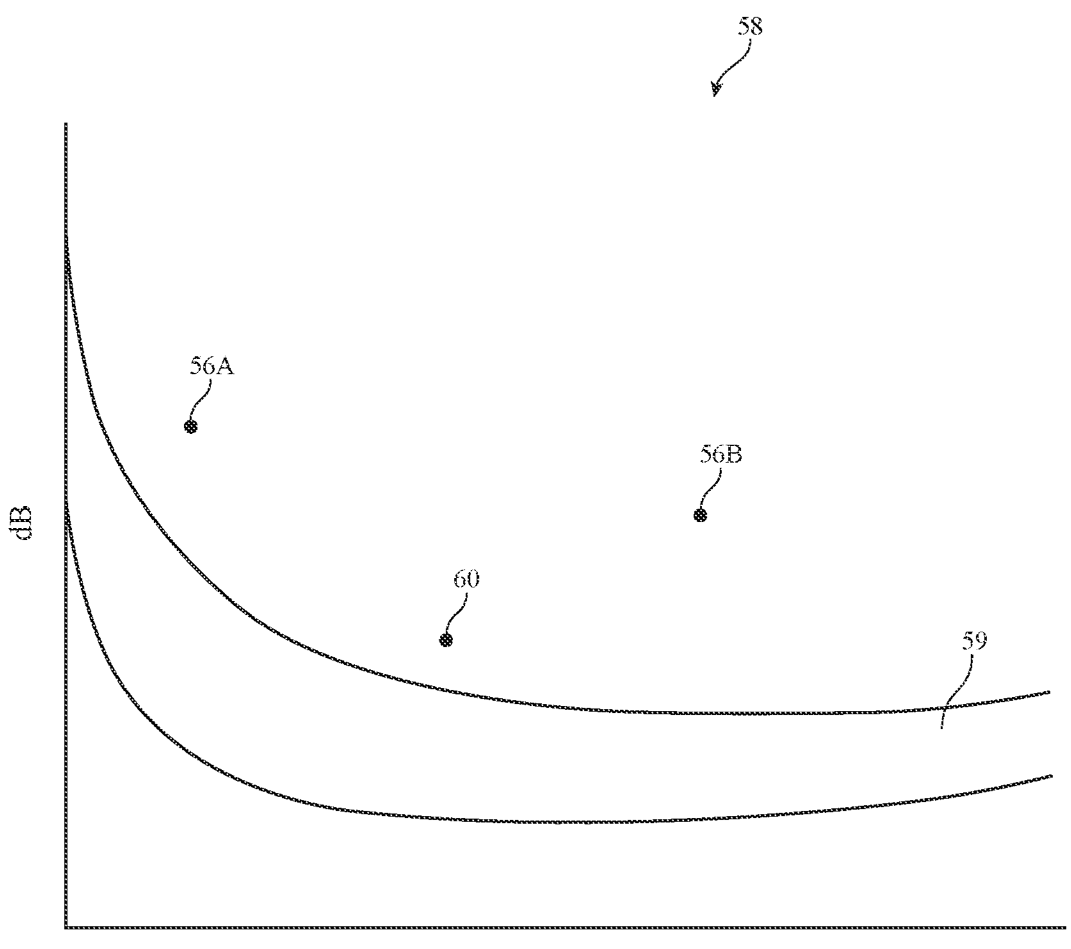
FIG. 7 is an illustrative spectrum that includes peak bands indicating ambient flicker and an aliasing band in accordance with some embodiments.

As shown in FIG. 7, graph 58 may have illustrative spectrum 59. As discussed above in connection with FIG. 7, spectrum 59 may have peaks 56A and 56B that correspond to the ambient light flicker (e.g., 120 Hz and 2 kHz). However, spectrum 59 may also have aliasing band 60. Aliasing band 60 may be, for example, at 1 kHz. Normally, aliasing band 60 could be avoided by performing a low pass filter on Vout before sampling, but this would distort the sawtooth waveform (e.g., curve 46 of FIG. 6A), making reconstructing Vdelt challenging. Alternatively, a resistor-capacitor (RC) filter may be added to filter the photodiode current (e.g., the current from photodiode 34 of FIG. 3), but this would require very large R and C values to get a 4 kHz cutoff frequency.

Figure 8A:
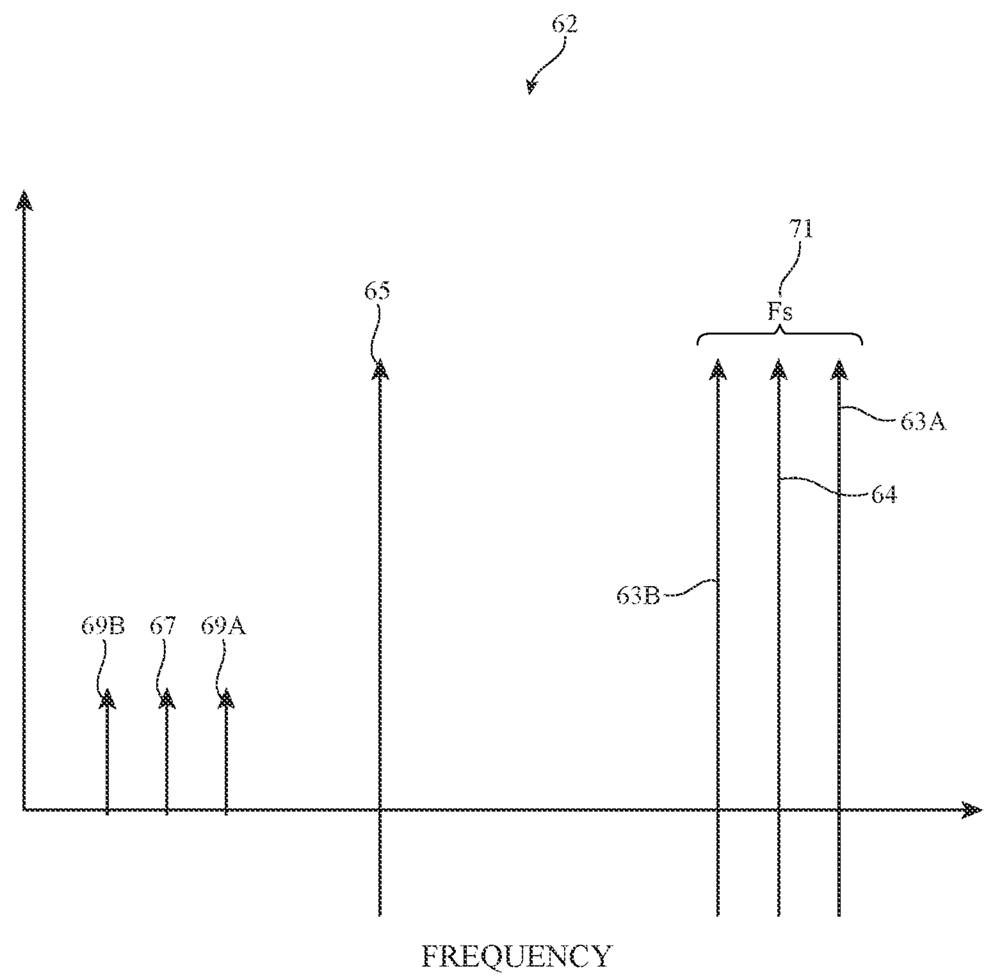
FIGS. 8A and 8B show an illustrative example of using non-uniform sampling to mitigate aliasing in accordance with some embodiments.
Figure 8B:
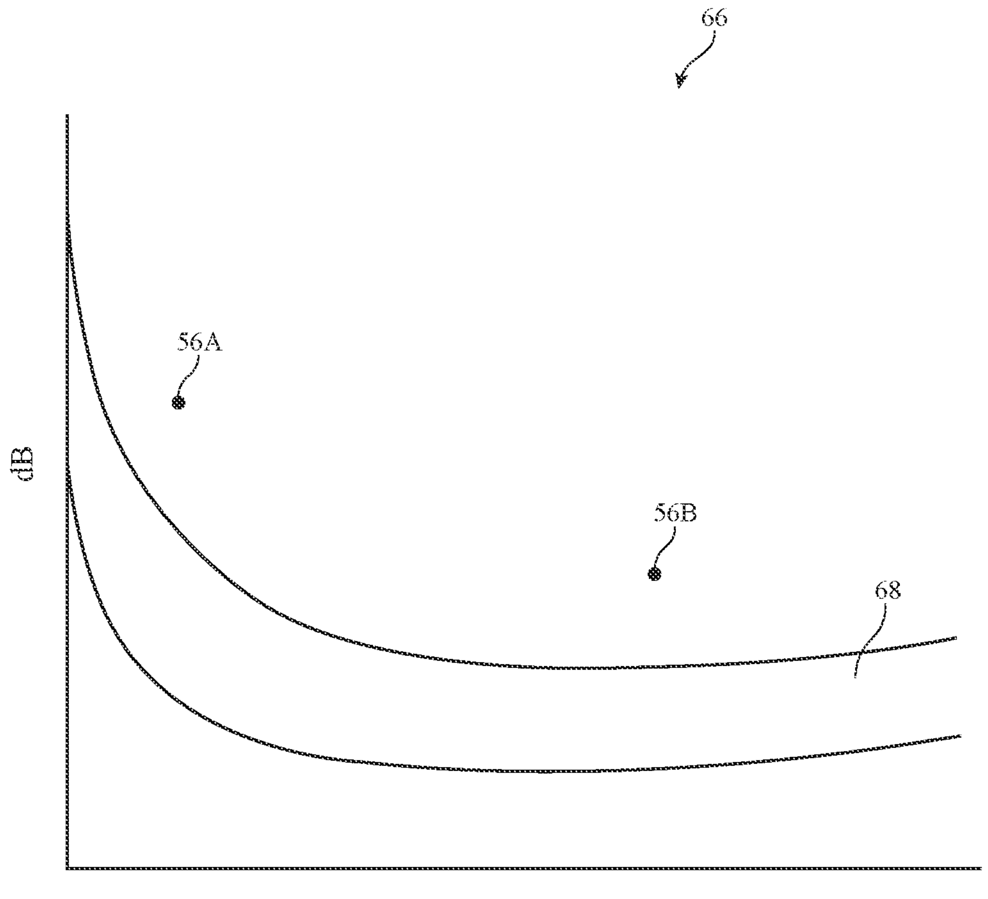

Therefore, non-uniform sampling may be used on Vout (e.g., sampling Vout in step 33 of FIG. 5). For example, Vout may be sampled at a random frequency in the range between 7-9 kHz (e.g., rather than at 8 kHz). This has the effect of converting the aliasing signal into broadband noise. An illustrative example is shown in FIGS. 8A and 8B As shown in FIG. 8A, in graph 62, non-uniform sampling Fs 71 of Vout may be performed. In particular, rather than sampling Vout at frequency 64 (e.g., 8 kHz), sampling may occur at frequency 63A, frequency 63B, and/or one or more other frequencies between and including 63A and 63B. For example, Vout may be sampled at both frequencies 63A and 63B (and/or additional frequencies), at one of frequencies 63A or 63B, at one of frequencies 63A or 63B with different phase between each of the sample points, or at a random frequency between frequency 63A and frequency 63B. Frequency 63A may be 9 kHz, and frequency 63B may be 7 kHz, as examples, if frequency 64 is 8 kHz. However, these frequencies are merely illustrative. In general, one or more frequencies may be used sample Vout non-uniformly.

By performing non-uniform sampling Fs 71, aliasing signals may be converted into broadband noise. In particular, instead of having one aliasing signal 67, which may be equivalent to aliasing band 60 of FIG. 7, non-uniform sampling Fs 71 may result in multiple, smaller signals 69A and 69B, which may amount to noise in the Vout signal. An illustrative example is shown in FIG. 8B.

As shown in FIG. 8B, illustrative spectrum 68 of graph 66 may have peaks 56A and 56B without aliasing bands (e.g., aliasing band 60 of FIG. 6). In other words, aliasing band 60 of FIG. 6 may be converted to noise (e.g., noise within spectrum 68) through non-uniform sampling of Vout. In this way, by using non-uniform sampling, aliasing bands may be reduced or eliminated, and ambient flicker may be determined.

Although FIG. 8B shows the aliasing bands being eliminated, the real ambient flicker signal 56B at 2 kHz is also attenuated by 10 dB. This is because the FFT (applied at step 37 of FIG. 5) assumes that the samples are uniformly sampled at 8 kHz. Therefore, a Lomb-Scargle spectral analysis may be used (e.g., instead of an FFT) when non-uniform sampling is used. A Lomb-Scargle spectral analysis may result in the same spectrum 68 of FIG. 8B, without the attenuation of signal 56B.

Performing a non-uniform FFT or Lomb-Scargle spectral analysis (e.g., as described in connection with FIGS. 8A and 8B) may use additional hardware. In some embodiments, therefore, it may be desirable to include a combination of hardware and software to perform a non-uniform FFT or Lomb-Scargle spectral analysis. For example, instead of randomizing the sampling frequency of Vout, two (or more) different sampling frequencies (e.g., both frequencies 63A and 63B of FIG. 8A) may be used, and the FFT of the two different sample rates may be compared to differentiate whether a given FFT signal is an in-band signal or an aliased signal. As an illustrative example, if there are two sampling frequencies 8 kHz and 9 kHz, all in-band signals below 4 kHz will show up at the same frequency at both FFTs (e.g., in the spectrum of FIG. 8B for the FFTs at both 8 kHz and 9 kHz) but the out of band >4.5 kHz aliased signal will be offset by 1 kHz between the two FFTs. The out of band aliased signal may then be disregarded as an aliased signal. In this way, ambient flicker signals may be differentiated from alias bands by using two (or more) sampling frequencies. Doing so may reduce the need for additional hardware.

Although FIGS. 3-8 describe using a sigma-delta converter for ambient flicker detection (and ambient light intensity detection, if desired), a folding capacitive transimpedance amplifier (C-TIA) may alternatively or additionally be used to determine ambient flicker. An illustrative example is shown in FIG. 9.

Figure 9:
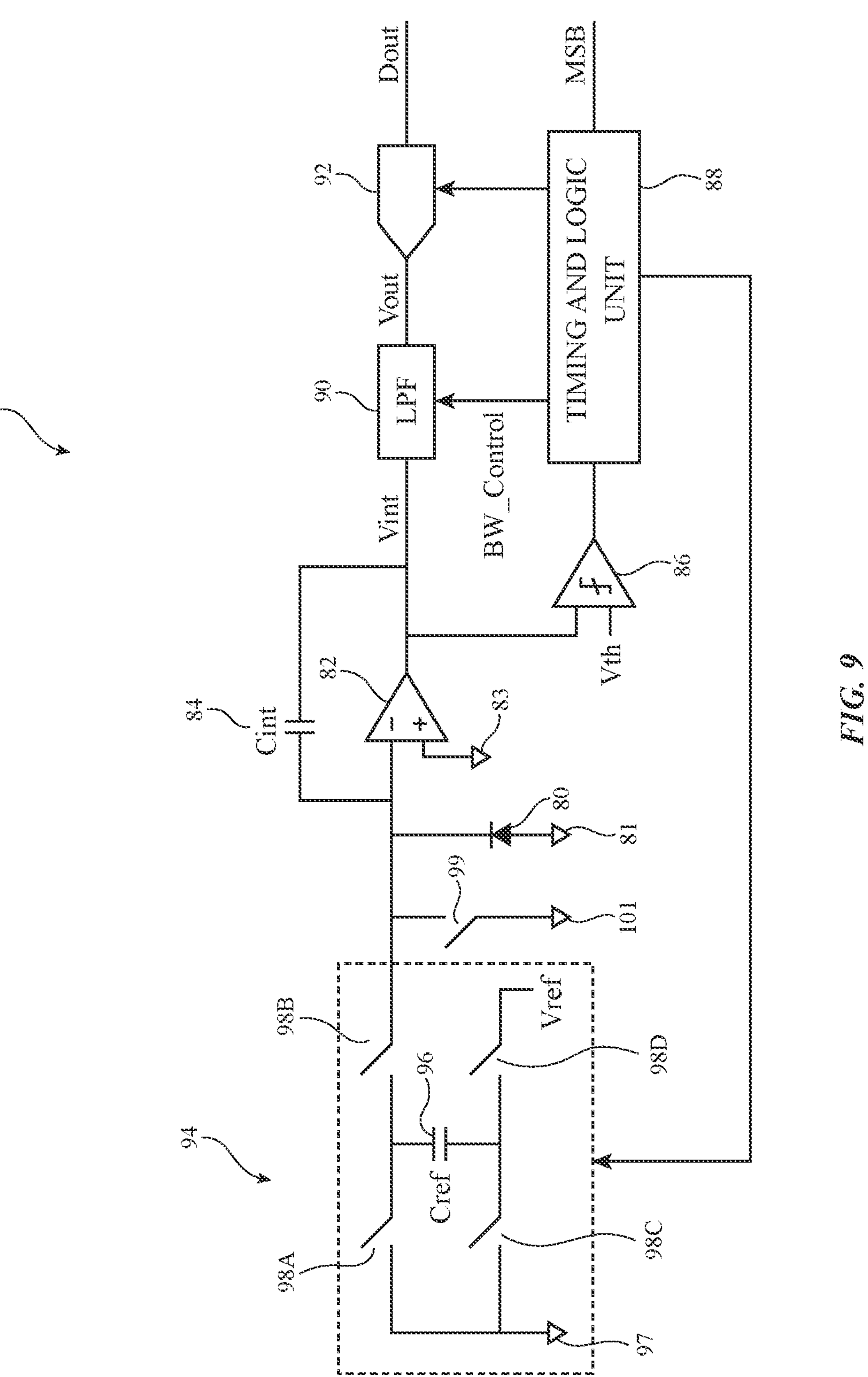
FIG. 9 is a diagram of an illustrative folding capacitive transimpedance amplifier (C-TIA) circuit in accordance with some embodiments.

As shown in FIG. 9, folding C-TIA circuit 78 may include photodiode 80, integrating capacitor Cint 84, amplifier 82 (which may be an operational transconductance amplifier (OTA) or other suitable amplifier), comparator 86, reference capacitor Cref 96, low-pass filter (LPF) 90, analog to digital converter (ADC) 92, timing and logic circuit 88, and switches 98. Cref 96 and switches 98 may form folding circuit 94.

Photodiode 80 may be coupled to integrating capacitor Cint 84 and to the input of amplifier 82 with ground 83. The output of integrating capacitor Cint 84 may be coupled to LPF 90 and to the input of comparator 86. Voltage Vth may also be coupled to the input of comparator 86. Cint 84 may bridge the input and output of amplifier 82.

The output of comparator 86 may be coupled to timing and logic unit 88, which may have output MSB (most significant bit), as well as output BW_control to LPF 90 and a sampling rate output to ADC 92. ADC 92 may receive Vout from LPF 90 and the sampling rate from timing and logic unit 88, and may convert Vout to output Dout. Dout may correspond to the Vout signal sampled by ADC 92 (e.g., the Vout values sampled as s(1), s(2), s(3), . . . s(n) of FIG. 6A).

The output of timing and logic unit 88 may also be coupled to folding circuit 94. Folding circuit 94 may include switches 98A and 98B coupled in series on one side of capacitor Cref 96 and switches 98C and 98D coupled in series on the opposing side of capacitor Cref 96. Switch 98D may be coupled to reference voltage Vref. Switch 99 may be coupled between folding circuit 94 and photodiode 80.

Switch 98C may be coupled to switch 98A and to ground 97, switch 99 may be coupled to ground 101, and photodiode 80 may be coupled to ground 81.

In operation, the charge dump (e.g., the charge dump shown in the reduction of Vout in FIGS. 4 and 6A) may be synchronized with the clock of ADC 92 to limit signal noise. In particular, the front end of folding C-TIA circuit 78 (e.g., photodiode 80, Cint 84, and amplifier 82) may integrate the current produced by photodiode 80 (as discussed above in connection with sigma-delta converter 32 of FIG. 3), with comparator 86 monitoring its output Vint. When Vint>Vth (the threshold voltage for comparator 86), comparator 86 trips and generates a pulse as an input signal to the timing control logic unit 88.

The timing & logic unit (TLU) 88 manages the clocks for the following circuit blocks: 1) folding circuit 94; 2) LPF 90; and 3) ADC 92. For folding circuit 94, TLU 88 runs a folding clock. When TLU 88 detects a trigger (e.g., from the input signal) from comparator 86, TLU 88 may initiate the folding clock for folding circuit 94. In particular, at the rising edge of the folding clock, the non-overlapping clocks required by the folding circuitry 94 (e.g., for switches 98A-98D) will be made available. As a result, folding circuit 94 may be enabled and a fold to the integrator (Cint 84) is conducted to reduce the output voltage Vout by a given voltage (Vref) while the integration process is still in progress without any interruption. In this way, folding circuit 94 (with capacitor 96) of folding C-TIA circuit 78 may be used to remove the charge from integrating capacitor Cint 84, and the MSB produced by TLU 88 may be used to determine ambient light intensity and flicker (as discussed above in FIG. 5).

Figure 10:
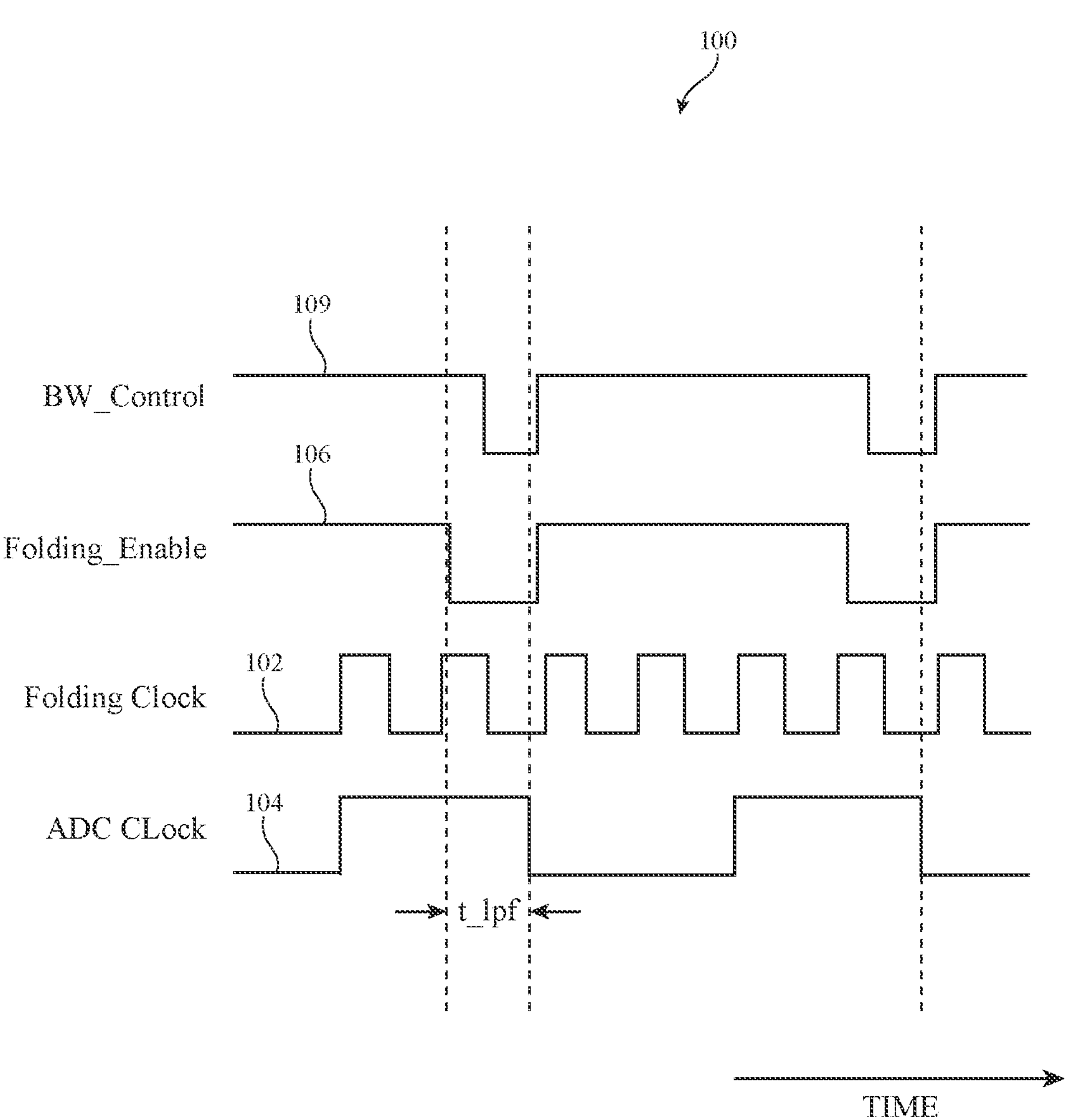
FIG. 10 is a diagram of an illustrative timing diagram that may be used for a C-TIA circuit in accordance with some embodiments.

An illustrative timing diagram that may be used with a folding C-TIA circuit, such as folding C-TIA circuit 78, is shown in FIG. 10. As shown in timing diagram 100 of FIG. 10, folding clock 102 (e.g., the clock for folding circuit 94) may have a frequency that is a multiple of ADC sampling clock 104. In the illustrative example of FIG. 10, a multiple of four is used. However, this is merely illustrative. In general, any suitable multiple may be used.

To allow low pass filter 90 (FIG. 9) to have enough time to settle to the required accuracy before the ADC (92) samples its output, the folding is disabled when Folding_Enable 106 is low, regardless the status of the comparator 86. In other words, during the period of t_lpf, the folding circuit 94 (FIG. 9) will take no action. Therefore, depending on the input photodiode current (e.g., the current generated by photodiode 80 of FIG. 9), the integrator output (Vint) will keep rising after surpassing the comparator threshold voltage Vth. As a result, the time t_lpf sets the dynamic range of the integrating capacitor 84, as well as the integration capacitance. After the ADC sampling (e.g., when ADC sampling clock 104 goes low), the circuits will complete the fold if Vint>Vth as detected by the comparator 86.

To help shorten t_lpf, or to allow the low pass filter 90 (FIG. 9) to settle to higher accuracy, a dynamic bandwidth switching scheme can be implemented. As shown in FIG. 10, when BW_Control 108 is high, the low pass filter 90 is in high bandwidth mode (e.g., in MHz range) by using a switch to short the resistor in the low pass filter (90). During the BW_Control low period, the low pass filter (90) switches to a lower bandwidth mode (e.g., in kHz range, such as 8 KHz).

The folding clock 102 can be synchronized with a light source in the other application (e.g. proximity sensor). For example, the light source may follow an "on, off, on, off" pattern, and folding clock 102 may follow the same pattern or an opposite pattern. In particular, the TLU 88 (FIG. 9) may generate the light source clock to pulse the light source and synchronize it with the folding clock 102. In this manner, no reset may be needed for the integrator front end.

The voltage Vout may be sampled by ADC 92 (FIG. 9). After sampling, post-processing may be performed to reconstruct the signal from ADC 92 in the digital domain. As an example, the post-processing may be performed after an ADC (e.g., ADC 92 of FIG. 9) samples Vout at 8 kHz (assuming maximum light flicker frequency of 4 kHz) to give s(1), s(2), s(3) etc. (see, e.g., FIG. 5), and the TLU 88 (FIG. 9) outputs the number of folds for each sample MSB(1), MSB(2), MSB(3), etc. In general, however, the ADC may sample Vout at any suitable frequency. An illustrative example of steps used to reconstruct the signal from the ADC in the digital domain is shown in FIG. 11.

Figure 11:
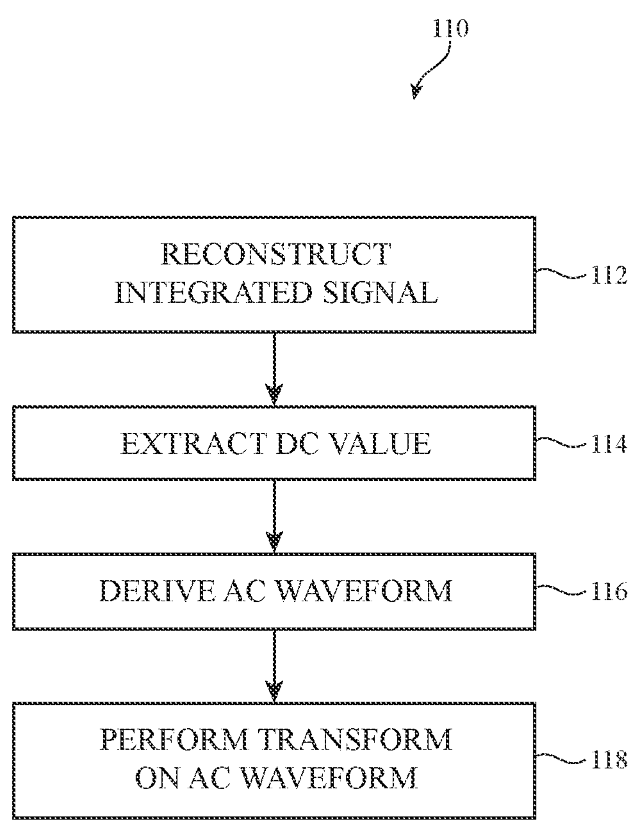
FIG. 11 is a flowchart of illustrative steps that may be used to reconstruct a signal from the C-TIA circuit in accordance with some embodiments.

As shown in flowchart 110 of FIG. 11, at step 112, the integrated signal (e.g., the signal produced by photodiode 80 of FIG. 9) may be reconstructed in the digital domain. The integrated signal in the digital domain (D_vout(n)) may be determined using Equation 5, $$\text{D\_Vout}(n) = s(n) + \text{V}ref * MSB(n) \tag{5}$$

where MSB(n) is the number of folds (e.g., as determined by TLU 88 of FIG. 9) prior to the time at which s(n) is sampled.

At step 114, a DC value may be extracted from the integrated signal in the digital domain. In particular, the DC value of light may be determined using Equation 6, $$\text{DC} = \text{D\_Vout}(N)/N \tag{6}$$

where N is the total number of samples in the integrated signal.

At step 116, an AC waveform may be determined using Equation 7, $$\text{AC}(n) = \text{D\_Vout}(n+1) - \text{D\_Vout}(n) - \text{DC} \tag{7}$$

Finally, at step 118, a transform may be performed on the AC waveform. In particular, an FFT and/or a Lomb-Scargle spectral analysis may be performed on AC(n) to get the frequency response of the signal where the light source flicker frequency is shown as peaks (e.g., as shown in FIG. 8B).

In this way, the signal in the digital domain may be reconstructed. The signal may give a frequency spectrum (e.g., as shown in FIGS. 6-8) with peaks that correspond to the frequency of ambient light flicker. In this way, ambient light flicker may be determined using the folding C-TIA circuit 78 of FIG. 9.

In some embodiments, an alternative circuit to folding C-TIA circuit 78 of FIG. 9 may be used to detect ambient light flicker. In particular, a circuit with a constant current source may be used to determine the amount of ambient flicker. An illustrative example is shown in FIG. 12

Figure 12:
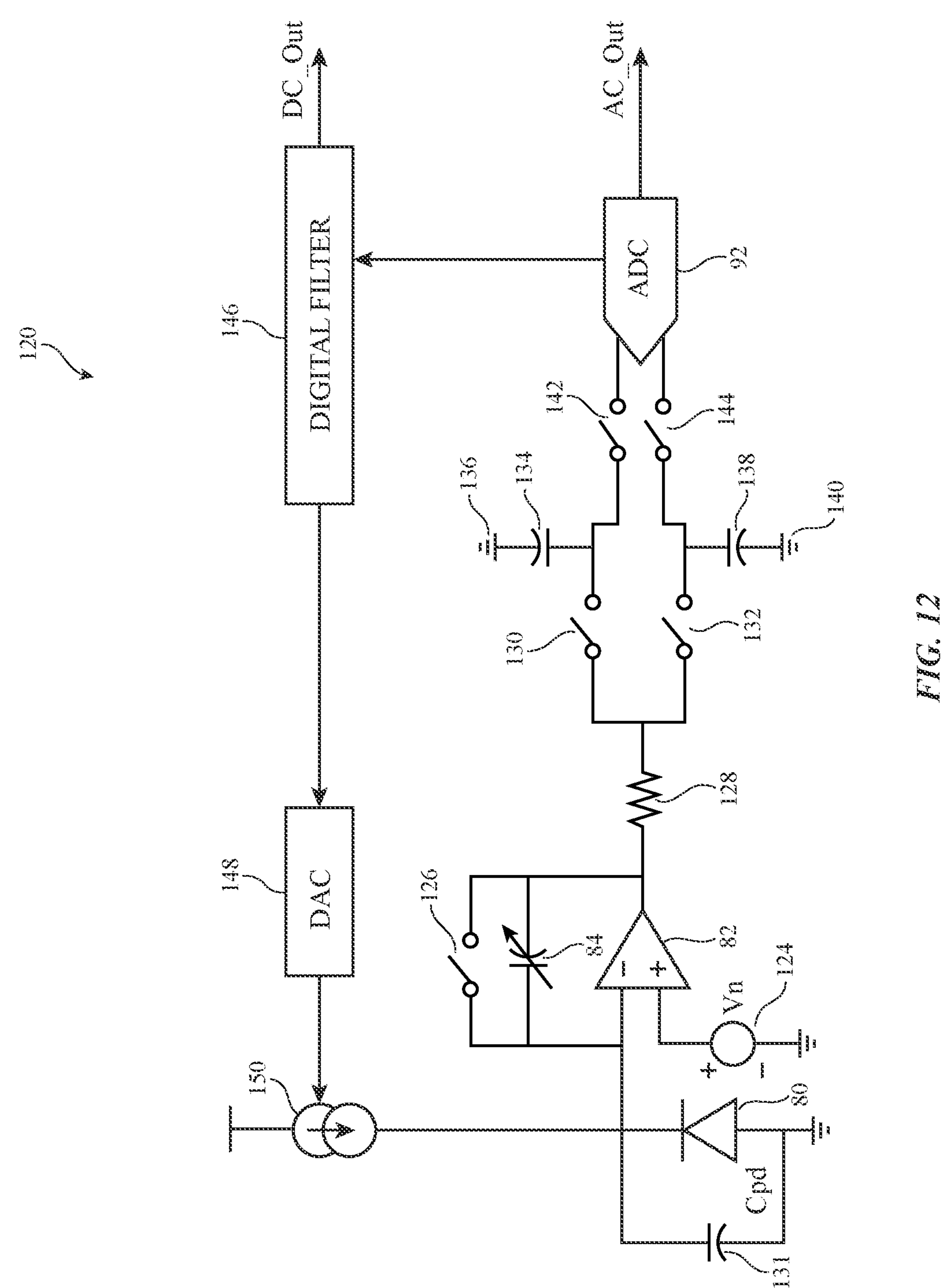
FIG. 12 is a diagram of an illustrative ambient flicker detection circuit that includes a digital filter and a constant current source in accordance with some embodiments.

As shown in FIG. 12, circuit 120 (also referred to as an ambient flicker detection circuit and a digital filter circuit herein) may include photodiode 80 with an input coupled to ground and an output coupled to amplifier 82. Capacitor Cpd 131 may bridge photodiode 80. Voltage source Vn 124 may have a grounded negative terminal and a positive terminal coupled to amplifier 82. Integrating capacitor 84 and switch 126 may bridge amplifier 82.

The output of integrating capacitor 84 may be coupled to filtering resistor 128, which in turn may be coupled in series to switches 130 and 132. Switch 130 may be coupled to capacitor 134 and to switch 142, while switch 132 may be coupled to capacitor 138 and switch 144. Switches 142 and 144 may be coupled to ADC 92 that has an output AC_OUT and an additional output coupled to digital filter 146. Digital filter 146 may have an output DC_OUT and an additional output coupled to digital to analog converter (DAC 148). DAC 148 may be coupled to constant current source 150, which in turn is coupled to the input of amplifier 82 with the output of photodiode 80, thereby completing the loop.

In operation, photodiode 80 may generate charge in response to incident light, and the charge may be stored at Cpd 131. The generated charge may pass to filtering resistor 128 through integrating capacitor 84. If the generated charge is above the resistance of filtering resistor 128, it may pass to either capacitor 134 or capacitor 136 depending on which switch 130 or 132 is open. For example, switches 130 and 132 may alternate being opened and closed in successive integrations of the generated charge.

Switch 140 or switch 144 may be closed, passing the generated charge to ADC 92. ADC 92 may convert the charge to a digital signal, AC_OUT. The digital signal may also be passed to digital filter 146, which may produce output DC_OUT. The output may also be passed to DAC 148, which may drive current source 150.

Between integrations, amplifier 82 may be reset using switch 126 (e.g., by closing switch 126).

AC_OUT may be a digital value that represents ambient light flicker, while DC_OUT may be a digital value that represents ambient light without flicker. In particular, because of the feedback loop with current source 150 being driven by the current from photodiode 80 (after passing through ADC 92 and digital filter 146), as well as the fixed nature of ambient light that is not impacted by flicker (which will be reflected in DC_OUT), ADC 92 will only receive ambient light flicker once current source 150 is set to the current generated by photodiode 80. In this way, ambient light flicker may be determined by a circuit using a digital filter and a constant current source.

In general, the methods of FIGS. 5 and/or 11 of detecting ambient flicker may be used with the sigma-delta converter of FIG. 4, the C-TIA circuit of FIG. 9, and/or the digital filter circuit of FIG. 12. In this way, a sigma-delta converter, C-TIA circuit, or digital filter circuit may be used to detect ambient flicker.

Regardless of the method and circuitry used to detect an ambient flicker measurement, the ambient flicker measurement may be used in any suitable manner. For example, control circuitry in a device, such as control circuitry 16 in device 10 of FIG. 1, may use an ambient flicker measurement to adjust one or more sensors, such as cameras or other optical sensors, in the device. Alternatively or additionally, the ambient flicker measurement may be taken intermittently with the activation of a light source in a proximity sensor, and the ambient flicker measurement may be subtracted out of measurements from the proximity sensor. In this way, the ambient flicker measurement may be used to adjust one or more components in an electronic device and/or correct one or more optical measurements.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to have control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. A folding capacitive transimpedance amplifier circuit, comprising:

a photodiode configured to generate charge in response to ambient light;

an integrating capacitor that receives the generated charge;

a low pass filter configured to receive and filter the generated charge;

a folding circuit coupled to the integrating capacitor, wherein the folding circuit is configured to complete a fold into the integrating capacitor to reduce the generated charge on the integrating capacitor when the generated charge exceeds a threshold voltage;

an analog to digital converter configured to convert the filtered generated charge and produce an output voltage;

a timing and logic unit coupled to the low pass filter, the analog to digital converter, and the folding circuit; and a comparator that receives the generated charge from the integrating capacitor and compares the generated charge to the threshold voltage, wherein the timing and logic unit is configured to receive a signal from the comparator, and wherein the timing and logic unit is configured to clock the low pass filter, the analog to digital converter, and the folding circuit based on the signal from the comparator.

2. The folding capacitive transimpedance amplifier circuit of claim 1, wherein the folding circuit is configured to be enabled by the timing and logic unit when the signal from the comparator indicates that the generated charge exceeds the threshold voltage, and the folding circuit is configured to complete the fold into the integrating capacitor when the folding circuit is enabled.

3. The folding capacitive transimpedance amplifier circuit of claim 2, wherein the fold into the integrating capacitor is configured to reduce the generated charge on the integrating capacitor to reduce the output voltage by a given voltage.

4. The folding capacitive transimpedance amplifier circuit of claim 1, wherein the timing and logic unit is configured to clock the folding circuit with a first clock and to clock the analog to digital converter with a second clock that is a multiple of the first clock.

5. The folding capacitive transimpedance amplifier circuit of claim 1, wherein the folding circuit comprises a plurality of switches and a capacitor.

6. The folding capacitive transimpedance amplifier circuit of claim 5, wherein the capacitor of the folding circuit is configured to reduce the generated charge on the integrating capacitor to reduce the output voltage in response to signals from the timing and logic unit.

7. A folding capacitive transimpedance amplifier circuit, comprising:

a photodiode configured to generate charge in response to ambient light;

an integrating capacitor that receives the generated charge;

a folding circuit coupled to the integrating capacitor, wherein the folding circuit is configured to complete a fold into the integrating capacitor to reduce the generated charge on the integrating capacitor when the generated charge exceeds a threshold voltage;

an analog to digital converter configured to convert the generated charge and produce an output voltage;

a timing and logic unit coupled to the analog to digital converter and the folding circuit; and a comparator that receives the generated charge from the integrating capacitor and compares the generated charge to the threshold voltage, wherein the timing and logic unit is configured to receive a signal from the comparator, and wherein the timing and logic unit is configured to clock the analog to digital converter and the folding circuit based on the signal from the comparator.

8. A folding capacitive transimpedance amplifier circuit, comprising:

a photodiode configured to generate charge in response to ambient light;

an integrating capacitor that receives the generated charge;

a low pass filter configured to receive and filter the generated charge;

a folding circuit coupled to the integrating capacitor, wherein the folding circuit is configured to complete a fold into the integrating capacitor to reduce the generated charge on the integrating capacitor when the generated charge exceeds a threshold voltage;

a timing and logic unit coupled to the low pass filter and the folding circuit; and a comparator that receives the generated charge from the integrating capacitor and compares the generated charge to the threshold voltage, wherein the timing and logic unit is configured to receive a signal from the comparator, and wherein the timing and logic unit is configured to clock the low pass filter and the folding circuit based on the signal from the comparator.

* * * * *